(12) United States Patent
Lee et al.

(10) Patent No.: US 9,153,641 B2
(45) Date of Patent: Oct. 6, 2015

(54) WAFER LEVEL PACKAGE HAVING CYLINDRICAL CAPACITOR AND METHOD OF FABRICATING THE SAME

(71) Applicant: SAMSUNG ELECTRO-MECHANICS CO., LTD., Suwon-si (KR)

(72) Inventors: Seung Seoup Lee, Gyunggi-do (KR); Soon Gyu Yim, Seongnam-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 184 days.

(21) Appl. No.: 13/752,238

(22) Filed: Jan. 28, 2013

(65) Prior Publication Data

US 2013/0147014 A1    Jun. 13, 2013

Related U.S. Application Data

(62) Division of application No. 12/770,614, filed on Apr. 29, 2010, now Pat. No. 8,378,452.

(30) Foreign Application Priority Data

Aug. 17, 2009  (KR) ......................... 10-2009-0075760
Jan. 15, 2010  (KR) ......................... 10-2010-0003866

(51) Int. Cl.
*H01L 29/92* (2006.01)
*H01L 21/02* (2006.01)
*H01L 49/02* (2006.01)
(Continued)

(52) U.S. Cl.
CPC ............ *H01L 28/60* (2013.01); *H01L 23/5223* (2013.01); *H01L 28/90* (2013.01); *H01L 23/3114* (2013.01); *H01L 2224/131* (2013.01); *H01L 2924/01002* (2013.01); *H01L 2924/01011* (2013.01); *H01L 2924/01013* (2013.01); *H01L 2924/01019* (2013.01); *H01L 2924/01029* (2013.01); *H01L 2924/01046* (2013.01); *H01L 2924/01078* (2013.01);
(Continued)

(58) Field of Classification Search
CPC ................... H01L 2924/19041; H01L 23/481; H01L 23/642
USPC ........... 257/532, 296–310, E29.342, E21.011
See application file for complete search history.

(56) References Cited

U.S. PATENT DOCUMENTS

| | | | |
|---|---|---|---|
| 7,700,986 B2 * | 4/2010 | Huang et al. ................... | 257/532 |
| 7,821,108 B2 * | 10/2010 | Hollis ........................... | 257/621 |
| 7,960,773 B2 | 6/2011 | Chang | |
| 8,107,254 B2 * | 1/2012 | Bandholz et al. ............. | 361/763 |
| 8,693,163 B2 * | 4/2014 | Su et al. ........................ | 257/303 |

(Continued)

*Primary Examiner* — Cuong Q Nguyen
(74) *Attorney, Agent, or Firm* — NSIP Law

(57) ABSTRACT

Disclosed is a wafer level package having a cylindrical capacitor, which is capable of increasing electrostatic capacity thanks to the use of a cylindrical capacitor structure and which includes a wafer chip having a bonding pad formed thereon and an insulating layer formed thereon and exposing the bonding pad, a redistribution layer connected to the bonding pad and extending to one side of the insulating layer, a cylindrical outer electrode connected to the redistribution layer and having a center opening therein, a cylindrical inner electrode formed in the center opening of the outer electrode so as to be separated from the outer electrode, a dielectric layer formed between the outer electrode and the inner electrode, and a resin sealing portion formed on the insulating layer to cover the redistribution layer, the inner electrode, the outer electrode and the dielectric layer and having a first recess for exposing an upper surface of the inner electrode. A method of fabricating the wafer level package having a cylindrical capacitor is also provided.

6 Claims, 27 Drawing Sheets

(51) Int. Cl.
*H01L 23/522* (2006.01)
*H01L 23/31* (2006.01)

(52) U.S. Cl.
CPC .. *H01L 2924/01079* (2013.01); *H01L 2924/14* (2013.01); *H01L 2924/19041* (2013.01)

(56) References Cited

U.S. PATENT DOCUMENTS

2009/0267183 A1 10/2009 Temple
2010/0230806 A1 9/2010 Huang
2010/0244189 A1 9/2010 Klootwijk \* cited by examiner

WAFER LEVEL PACKAGE HAVING CYLINDRICAL CAPACITOR AND METHOD OF FABRICATING THE SAME

CROSS REFERENCE TO RELATED APPLICATION

This application is a Divisional of U.S. patent application Ser. No. 12/770,614, filed Apr. 29, 2010, entitled "Wafer Level Package Having Cylindrical Capacitor and Method of Fabrication The Same", which claims the benefit of Korean Patent Application No. 10-2009-0075760, filed Aug. 17, 2009, entitled "A wafer level package having cylindrical capacitor and a fabricating method the same", and Korean Patent Application No. 10-2010-0003866, filed Jan. 15, 2010, entitled "A wafer level package having cylindrical capacitor and a fabricating method the same", all of which are hereby incorporated by reference in their entirety into this application.

BACKGROUND OF THE INVENTION

1. Technical Field

The present invention relates to a wafer level package having a cylindrical capacitor and a method of fabricating the same.

2. Description of the Related Art

Recently, the electronics industry has advanced so that products which are lightweight, slim, short and small and which have multi-functionality and high performance are supplied at low price. To this end, a packaging technique is employed. In particular, a wafer level package which is packaged on a wafer is receiving attention these days.

Typically, a wafer level package includes a capacitor embedded therein in order to achieve signal stability. FIG. 1 is a cross-sectional view showing a wafer level package including a capacitor having a two-dimensional planar structure according to a conventional technique.

As shown in FIG. 1, the wafer level package 10 including a capacitor having a two-dimensional planar structure according to the conventional technique includes a wafer chip 12 having a bonding pad provided at the upper surface thereof and an insulating layer 18 formed thereon and exposing the bonding pad, a lower electrode 34 formed on the insulating layer 18, a dielectric layer 38 formed on the lower electrode 34, a redistribution to layer 36 one side of which is connected to the bonding pad and which extends onto the dielectric layer 38 along the upper surface of the insulating layer 18 from the bonding pad, a passivation layer 28 formed on the insulating layer 18 to cover the redistribution layer 36, a metal post 30 formed on the other side of the redistribution layer 36, and a solder ball 14 formed on the metal post 30.

As such, the redistribution layer 36 extending onto the dielectric layer 38 may simultaneously function as an upper electrode of a capacitor unit 32. Specifically, the capacitor unit 32 has a two-dimensional planar structure composed of the lower electrode 34, the redistribution layer 36 and the dielectric layer 38.

However, because the capacitor unit 32 provided in the wafer level package 10 has the two-dimensional planar structure described above, electrostatic capacity may be increased only by using a dielectric layer 38 having a higher dielectric constant, enlarging the area of the lower electrode 34 and the upper electrode, or reducing the distance between the electrodes. Hence, limitations are imposed on increasing the electrostatic capacity.

Also, the capacitor unit 32 having such a two-dimensional planar structure should be manufactured through an additional process (e.g. sputtering and patterning), undesirably increasing the manufacturing cost. Furthermore, as the thickness of the capacitor unit 32 is increased, problems related to material waste and an increase in the process time required to manufacture the wafer level package 10 may occur.

SUMMARY OF THE INVENTION

Accordingly, the present invention has been made keeping in mind the problems encountered in the related art and the present invention intends to provide a wafer level package having a cylindrical capacitor configured to increase electrostatic capacity, and a method of fabricating the same.

Also the present invention intends to provide a wafer level package having a cylindrical capacitor in which the thickness of the package is not increased and there is no need to additionally form an electrode in the manufacture of a capacitor, and a method of fabricating the same.

A first aspect of the present invention provides a wafer level package having a cylindrical capacitor, including a wafer chip including a bonding pad formed thereon and an insulating layer formed thereon and exposing the bonding pad; a redistribution layer connected to the bonding pad and extending to one side of the insulating layer; a cylindrical outer electrode connected to the redistribution layer and having a center opening therein; a cylindrical inner electrode formed in the center opening of the outer electrode so as to be separated from the outer electrode; a dielectric layer formed between the outer electrode and the inner electrode; and a resin sealing portion formed on the insulating layer to cover the redistribution layer, the inner electrode, the outer electrode and the dielectric layer and having a first recess for exposing an upper surface of the inner electrode.

In this aspect, the redistribution layer may include an outer electrode member formed at a lower surface of the outer electrode and having a center opening and a circular shape, and an inner electrode member formed at a lower surface of the inner electrode and having a circular shape so as to be separated from the outer electrode member.

Further, a metal post may be formed on a portion of the redistribution layer extending to the other side of the insulating layer, and the resin sealing portion may be formed to cover the metal post and may have a second recess for exposing an upper surface of the metal post.

A second aspect of the present invention provides a wafer level package having a cylindrical capacitor, including a wafer chip including a bonding pad formed thereon and an insulating layer formed thereon and exposing the bonding pad; a redistribution layer connected to the bonding pad and extending to one side of the insulating layer; a cylindrical outer electrode connected to the redistribution layer and having a center opening therein; a cylindrical inner electrode formed in the center opening of the outer electrode so as to be separated from the outer electrode; a dielectric layer formed between the outer electrode and the inner electrode; and a resin sealing portion formed on the insulating layer to cover the redistribution layer, the inner electrode, the outer electrode and the dielectric layer, wherein a lower surface of the inner electrode is connected to a peripheral wiring layer which is formed on the insulating layer and which extends from outside the outer electrode into a center opening of the outer electrode so as not to be connected to the outer electrode.

In this aspect, the redistribution layer may include the outer electrode member formed at a lower surface of the outer electrode and having the center opening and a circular shape, and an inner electrode member formed at a lower surface of the inner electrode and having a circular shape so as to be separated from the outer electrode member.

Also, the peripheral wiring layer may be formed across an upper surface of a first cover insulating layer formed to cover a portion of the outer electrode member and across a lower surface of a second cover insulating layer formed to cover a portion of the outer electrode, and thus may be connected to the inner electrode member from outside the outer electrode member in a state of not being connected to the outer electrode member nor to the outer electrode.

Further, a metal post may be formed on a portion of the redistribution layer extending to the other side of the insulating layer, and the resin sealing portion may be formed to cover the metal post and may have a recess for exposing an upper surface of the metal post.

A third aspect of the present invention provides a wafer level package having a cylindrical capacitor, which includes, in the wafer level package having a cylindrical capacitor according to the second aspect of the present invention, the redistribution layer which may include an outer electrode member, which is formed at a lower surface of the outer electrode, has a center opening and a circular shape, and includes an open portion formed at a portion of the outer electrode member; and an inner electrode member formed at a lower surface of the inner electrode and having a circular shape so as to be separated from the outer electrode member.

In this aspect, the peripheral wiring layer may be formed across a lower surface of a cover insulating layer formed to cover a portion of the outer electrode and the open portion of the outer electrode member, and thus may be connected to the inner electrode member from outside the outer electrode member in a state of not being connected to the outer electrode member nor to the outer electrode.

A fourth aspect of the present invention provides a method of fabricating the wafer level package having a cylindrical capacitor according to the first aspect of the present invention, including (A) preparing a wafer chip including a bonding pad formed thereon and an insulating layer formed thereon and exposing the bonding pad; (B) forming a redistribution layer, which is connected to the bonding pad and extends to one side of the insulating layer and which has a circular outer electrode member having a center opening therein and a circular inner electrode member formed in the center opening of the outer electrode member so as to be separated from the outer electrode member; (C) forming an inner electrode and an outer electrode on the inner electrode member and the outer electrode member, respectively, and then forming a dielectric layer between the inner electrode and the outer electrode; and (D) forming a resin sealing portion on the insulating layer to cover the redistribution layer, the inner electrode, the outer electrode and the dielectric layer, and then processing, on the resin sealing portion, a first recess for exposing an upper surface of the inner electrode.

In this aspect, (C) may include (C1) applying a photoresist on the insulating layer, (C2) forming a first opening and a second opening in the photoresist so as to expose the inner electrode member and the outer electrode member respectively, (C3) plating the first opening and the second opening, thus forming the inner electrode and the outer electrode, (C4) removing the photoresist, and (C5) filling a space between the inner electrode and the outer electrode with a dielectric material, and then annealing the dielectric material, thus forming the dielectric layer.

In (C5), the dielectric material may be charged using screen printing.

In (B), the redistribution layer may be formed to extend from one side of the insulating layer to the other side of the insulating layer in a state of being connected to the bonding pad; in (C), a metal post may be formed on a portion of the redistribution layer extending to the other side of the insulating layer; and in (D), the resin sealing portion may be formed to cover the metal post, and a second recess for exposing an upper surface of the metal post may be processed on the resin sealing portion.

A fifth aspect of the present invention provides a method of fabricating the wafer level package having a cylindrical capacitor according to the second aspect of the present invention, including (A) preparing a wafer chip including a bonding pad formed thereon and an insulating layer formed thereon and exposing the bonding pad; (B) forming a redistribution layer, which is connected to the bonding pad and extends to one side of the insulating layer and which has a circular outer electrode member having a center opening therein; (C) forming a first cover insulating layer to cover a portion of the outer electrode member, forming an peripheral wiring layer formed to extend into the outer electrode member across an upper surface of the first cover insulating layer from outside the outer electrode member and having a circular inner electrode member formed in the center opening of the outer electrode member, and then forming a second cover insulating layer to cover a portion of the peripheral wiring layer; (D) forming an inner electrode and an outer electrode on the inner electrode member and the outer electrode member, respectively, and then forming a dielectric layer between the inner electrode and the outer electrode; and (E) forming a resin sealing portion on the insulating layer to cover the redistribution layer, the inner electrode, the outer electrode and the dielectric layer.

In this aspect, (D) may include (D1) applying a photoresist on the insulating layer, (D2) forming a first opening and a second opening in the photoresist so as to expose the inner electrode member and the outer electrode member respectively, (D3) plating the first opening and the second opening, thus forming the inner electrode and the outer electrode, (D4) removing the photoresist and (D5) filling a space between the inner electrode and the outer electrode with a dielectric material, and then annealing the dielectric material, thus forming the dielectric layer.

In (D5), the dielectric material may be charged using screen printing.

In (B), the redistribution layer may be formed to extend from one side of the insulating layer to the other side of the insulating layer in a state of being connected to the bonding pad; in (D), a metal post may be formed on a portion of the redistribution layer extending to the other side of the insulating layer; and in (E), the resin sealing portion may be formed to cover the metal post, and a recess for exposing an upper surface of the metal post may be processed on the resin sealing portion.

A sixth aspect of the present invention provides a method of fabricating the wafer level package having a cylindrical capacitor according to the third aspect of the present invention, including (A) preparing a wafer chip including a bonding pad formed thereon and an insulating layer formed thereon and exposing the bonding pad; (B) forming a redistribution layer, which is connected to the bonding pad and extends to one side of the insulating layer and which has a circular outer electrode member having a center opening therein and an open portion formed at a portion thereof; (C) forming a peripheral wiring layer which extends into the outer electrode member across the open portion of the outer electrode member from outside the outer electrode member and has a circular inner electrode member formed in the center opening of the outer electrode member, and then forming a cover insulating layer to cover a portion of the peripheral wiring layer; (D) forming an inner electrode and an outer electrode on the inner electrode member and the outer electrode member, respectively, and then forming a dielectric layer between the inner electrode and the outer electrode; and (E) forming a resin sealing portion on the insulating layer to cover the redistribution layer, the inner electrode, the outer electrode and the dielectric layer.

In this aspect, (D) may include (D1) applying a photoresist on the insulating layer; (D2) forming a first opening and a second opening in the photoresist so as to expose the inner electrode member and the outer electrode member respectively; (D3) plating the first opening and the second opening, thus forming the inner electrode and the outer electrode; (D4) removing the photoresist; and (D5) filling a space between the inner electrode and the outer electrode with a dielectric material, and then annealing the dielectric material, thus forming the dielectric layer.

In this aspect, in (B), the redistribution layer may be formed to extend from one side of the insulating layer to the other side of the insulating layer in a state of being connected to the bonding pad; in (D), a metal post may be formed on a portion of the redistribution layer extending to the other side of the insulating layer; and in (E), the resin sealing portion may be formed to cover the metal post, and a recess for exposing an upper surface of the metal post may be processed on the resin sealing portion.

BRIEF DESCRIPTION OF THE DRAWINGS

The features and advantages of the present invention will be more clearly to understood from the following detailed description taken in conjunction with the accompanying drawings, in which:

FIGS. 5A and 5B to FIGS. 12A and 12B are cross-sectional views and top plan views, which sequentially show a process of fabricating the wafer level package having a cylindrical capacitor as shown in FIG. 2;

FIGS. 13A and 13B to FIGS. 21A and 21B are cross-sectional views and top plan views, which sequentially show a process of fabricating the wafer level package having a cylindrical capacitor as shown in FIG. 3; and FIGS. 22A and 22B to FIGS. 29A and 29B are cross-sectional views and top plan views, which sequentially show a process of fabricating the wafer level package having a cylindrical capacitor as shown in FIG. 4.

DESCRIPTION OF SPECIFIC EMBODIMENTS

Figure 1:
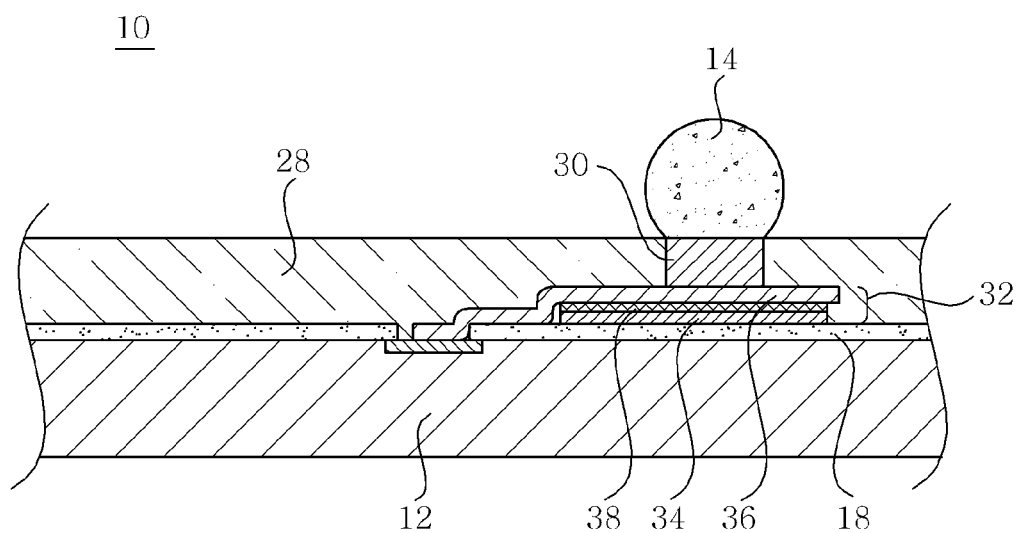
FIG. 1 is a cross-sectional view showing a wafer level package including a capacitor having a two-dimensional planar structure according to a conventional technique.

Hereinafter, a detailed description will be given of embodiments of the present invention with reference to the accompanying drawings. Throughout the drawings, the same reference numerals refer to the same or similar elements, and redundant descriptions are omitted. In the description, in the case where known techniques pertaining to the present invention are regarded as unnecessary because they would make the characteristics of the invention unclear and also for the sake of description, the detailed descriptions thereof may be omitted.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

<1$^{st}$ Embodiment: Wafer Level Package Having Cylindrical Capacitor>

Figure 2:
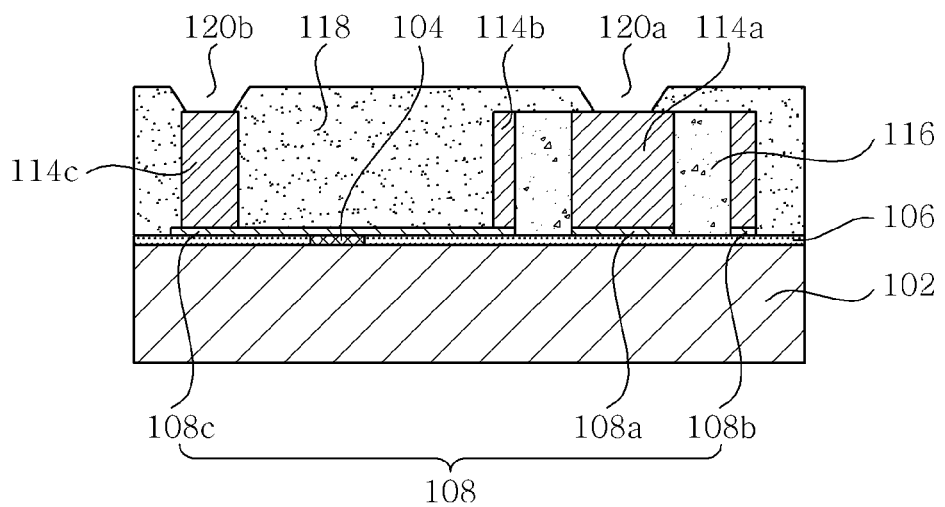
FIG. 2 is a cross-sectional view showing a wafer level package having a cylindrical capacitor according to a first embodiment of the present invention.

FIG. 2 is a cross-sectional view showing a wafer level package having a cylindrical capacitor according to a first embodiment of the present invention. With reference to this drawing, the wafer level package 100a having a cylindrical capacitor according to the present embodiment is described below.

As shown in FIG. 2, the wafer level package 100a having a cylindrical capacitor according to the present embodiment includes a wafer chip 102, a redistribution layer 108 (108a, 108b, 108c), a capacitor unit, and a resin sealing portion 118.

The wafer chip 102 includes a chip body made of a silicon material and containing an integrated circuit (not shown) embedded therein, a bonding pad 104 formed on the upper surface of the chip body so as to be electrically connected to the integrated circuit, and an insulating layer 106 formed on the upper surface of the chip body and exposing the bonding pad 104.

The redistribution layer 108 functions to guide wiring from the bonding pad 104 formed on the wafer chip 102 to a predetermined element which is larger than the bonding pad and is disposed at a position different from the position of the bonding pad, and is formed to extend onto one side of the insulating layer 106 from the bonding pad 104. Specifically, a portion of the redistribution layer 108 thus extending is connected to an electrode of the capacitor unit and includes a circular outer electrode member 108b having a center opening therein and a circular inner electrode member 108a formed in the center opening of the outer electrode member 108b so as to be separated from the outer electrode member 108b. The redistribution layer 108 is made of a conductive metal such as aluminum (Al), copper (Cu), nickel (Ni), gold (Au), etc.

The capacitor unit is provided in cylindrical form, and includes a cylindrical outer electrode 114b connected to the redistribution layer 108 and having a center opening therein, a cylindrical inner electrode 114a formed in the center opening of the outer electrode 114b so as to be separated from the outer electrode 114b, and a dielectric layer 116 formed between the outer electrode 114b and the inner electrode 114a.

The resin sealing portion 118 is used to protect both the redistribution layer 108 and the capacitor unit from the external environment, and is formed on the insulating layer 106 so as to cover the redistribution layer 108, the inner electrode 114a, the outer electrode 114b, and the dielectric layer 116. The resin sealing portion 118 may be composed of a photoresist, polyimide, epoxy, or an epoxy molding compound. Furthermore, the resin sealing portion 118 may have a first recess 120a for exposing the upper surface of the inner electrode 114a so as to connect the inner electrode 114a to an external electrode member (not shown). In the present embodiment, the outer electrode 114b is supplied with electric power from the wafer chip 102, and the inner electrode 114a is supplied with electric power from the external electrode member connected to the upper surface of the inner electrode 114a.

In the present invention, a cylindrical metal post 114c for distributing stress is formed on an end portion of the redistribution layer 108, that is, on the post member 108c, which extends onto the other side of the insulating layer 106 from the bonding pad 104. The metal post 114c is also covered with the resin sealing portion 118. As such, the resin sealing portion 118 may have a second recess 120b for exposing the upper surface of the metal post 114c so as to connect the metal post 114c to an external connection terminal linked with an external system.

Further, a surface treatment layer (not shown) or UBM (Under Ball Metal) may be formed on the metal post 114c in order to prevent corrosion and oxidation of the metal post. The surface treatment layer may be composed of a nickel (Ni) plating layer or a Ni alloy plating layer with or without having formed thereon any one selected from among a palladium (Pd) plating layer, a gold (Au) plating layer and sequentially disposed Pd plating layer and Au plating layer, and is thin.

<$2^{nd}$ Embodiment: Wafer Level Package having Cylindrical Capacitor>

Figure 3:
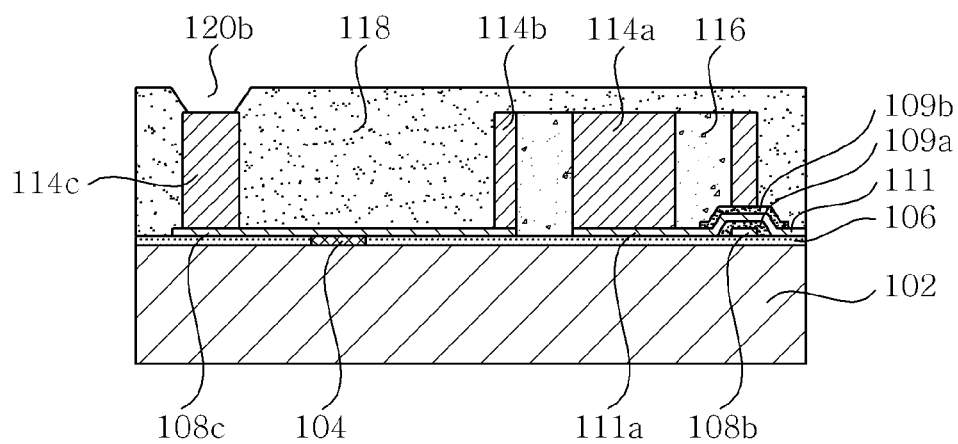
FIG. 3 is a cross-sectional view showing a wafer level package having a cylindrical capacitor according to a second embodiment of the present invention.

FIG. 3 is a cross-sectional view showing a wafer level package having a cylindrical capacitor according to a second embodiment of the present invention. With reference to this drawing, the wafer level package 100b having a cylindrical capacitor according to the present embodiment is described below.

As shown in FIG. 3, the wafer level package 100b having a cylindrical capacitor according to the present embodiment includes has fundamentally the same configuration as that of the wafer level package 100a having a cylindrical capacitor according to the first embodiment, with the exception that the inner electrode 114a is connected to a peripheral wiring layer 111 linked with a peripheral power source (not shown). Specifically, the lower surface of the inner electrode 114a is connected to the peripheral wiring layer 111 which is formed on the insulating layer 106 and which extends from outside the outer electrode member 108b into the center opening of the outer electrode member 108b so as not to be connected to the outer electrode member 108b nor to the outer electrode 114b.

The peripheral wiring layer 111 is formed across the upper surface of a first cover insulating layer 109a formed to cover a portion of the outer electrode member 108b, and thereby is connected to an inner electrode member 111a from outside the outer electrode member 108b in a state of not being connected to the outer electrode member 108b. Also, a second cover insulating layer 109b may be formed between the peripheral wiring layer 111 and the outer electrode 114b so that the peripheral wiring layer 111 and the outer electrode 114b are not connected to each other.

<$3^{rd}$ Embodiment: Wafer Level Package having Cylindrical Capacitor>

Figure 4:
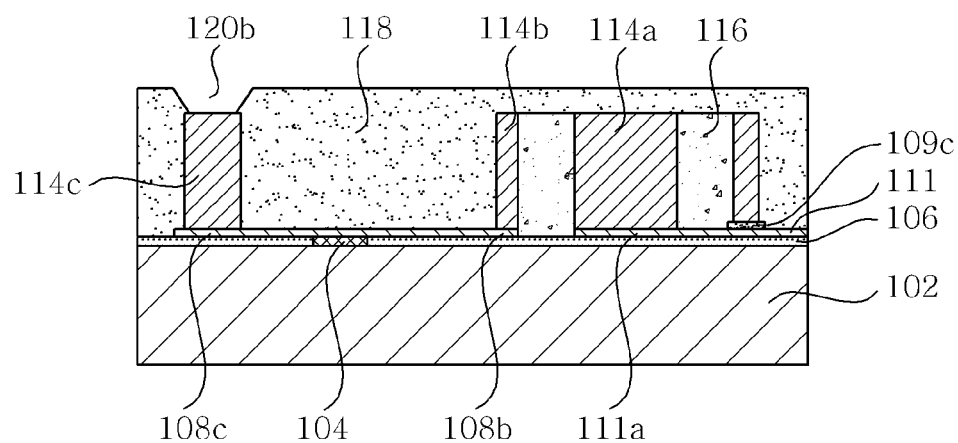
FIG. 4 is a cross-sectional view showing a wafer level package having a cylindrical capacitor according to a third embodiment of the present invention.

FIG. 4 is a cross-sectional view showing a wafer level package having a cylindrical capacitor according to a third embodiment of the present invention. With reference to this drawing, the wafer level package 100c having a cylindrical capacitor according to the present embodiment is described below.

Figure 24A:
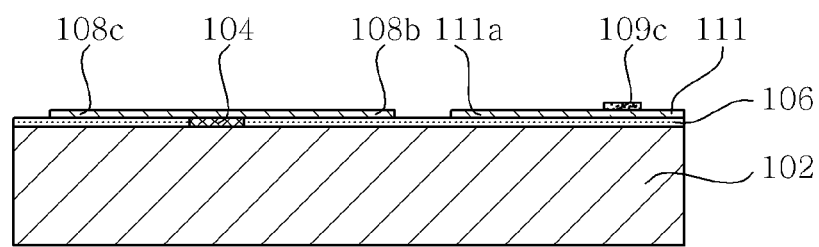
Figure 24B:
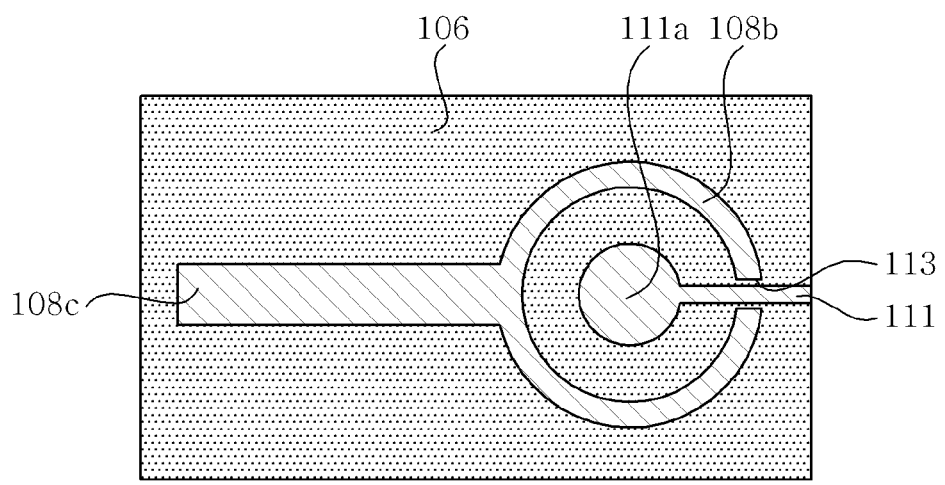

As shown in FIG. 4, the wafer level package 100c having a cylindrical capacitor according to the present embodiment includes has fundamentally the same configuration as that of the wafer level package 100b having a cylindrical capacitor according to the second embodiment, with the exception that an open portion 113 is formed at a portion of the outer electrode member 108b and a peripheral wiring layer 111 is formed across the open portion 113 (FIG. 24A and 24B).

Provided on the lower surface of the peripheral wiring layer 111 is an insulating layer 106, and the peripheral wiring layer 111 is formed across the lower surface of a cover insulating layer 109c formed to cover a portion of an outer electrode 114b, and thereby is connected to an inner electrode member 111a from outside the outer electrode member 108b in a state of not being connected to the outer electrode 114b or the outer electrode member 108b.

<Fabrication of Wafer Level Package having Cylindrical Capacitor according to the $1^{St}$ Embodiment>

FIGS. 5A and 5B to FIGS. 12A and 12B are cross-sectional views and top plan views, which sequentially show a process of fabricating the wafer level package having the cylindrical capacitor as shown in FIG. 2. Below, the method of fabricating the wafer level package having the cylindrical capacitor according to the present embodiment is specified with reference to the above drawings.

Figure 5A:
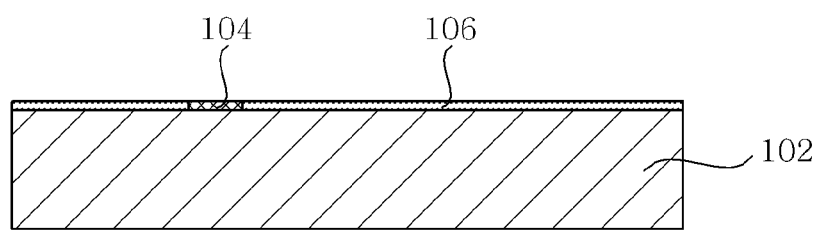
Figure 5B:
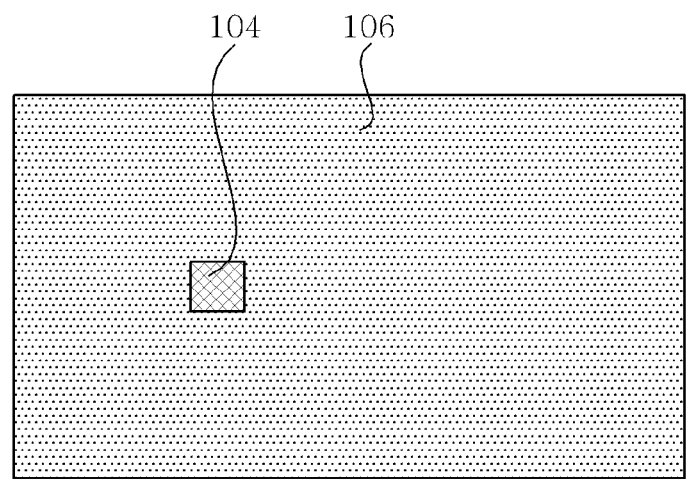

As shown in FIGS. 5A and 5B, a wafer chip 102 is prepared, which includes a chip body made of a silicon material and having an integrated circuit (not shown) embedded therein, a bonding pad 104 formed on the upper surface of the chip body so as to be electrically connected to the integrated circuit, and an insulating layer 106 formed on the upper surface of the chip body and which exposes the bonding pad 104.

Figure 6A:
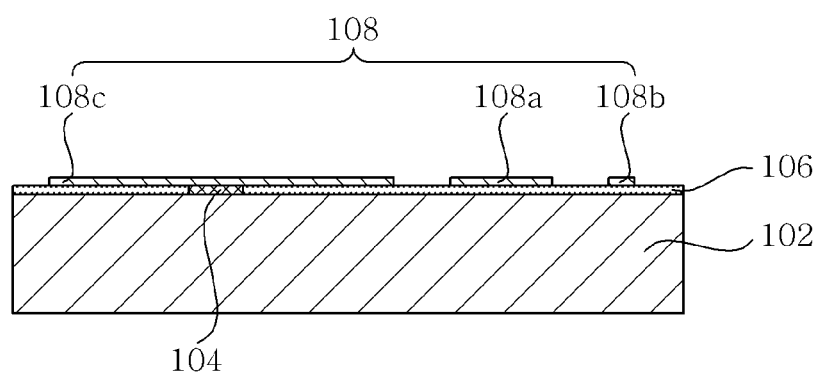
Figure 6B:
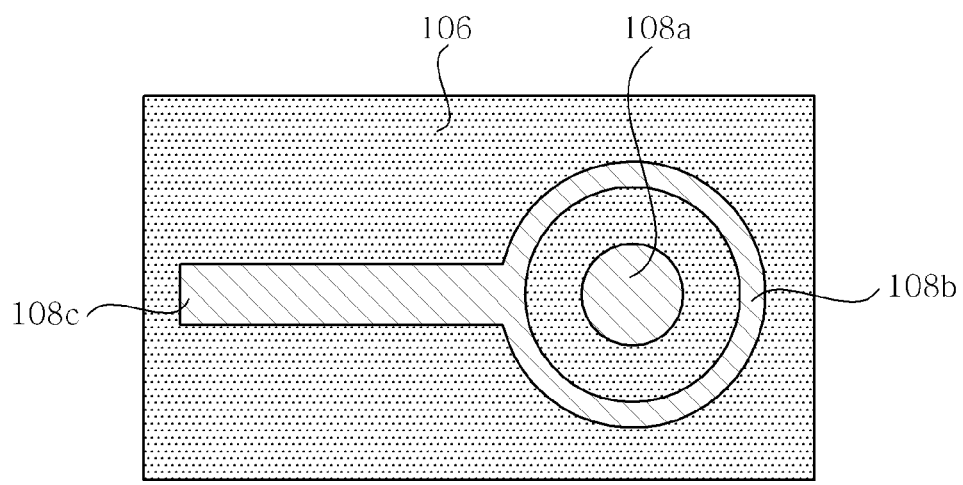

Next, as shown in FIGS. 6A and 6B, a redistribution layer 108 is formed, which is connected to the bonding pad 104 and extends onto the insulating layer 106.

The redistribution layer 108 is formed to extend to both sides of the bonding pad 104 from the bonding pad 104. As such, the portion of the redistribution layer which extends to one side of the bonding pad 104 is connected to an electrode of the capacitor unit, and includes a circular outer electrode member 108b having a center opening therein and a circular inner electrode member 108a formed in the center opening of the outer electrode member 108b so as to be separated from the outer electrode member 108b. The portion of the redistribution layer 108 extending to the other side of the bonding pad 104 may form a post member 108c connected to a post.

Figure 7A:
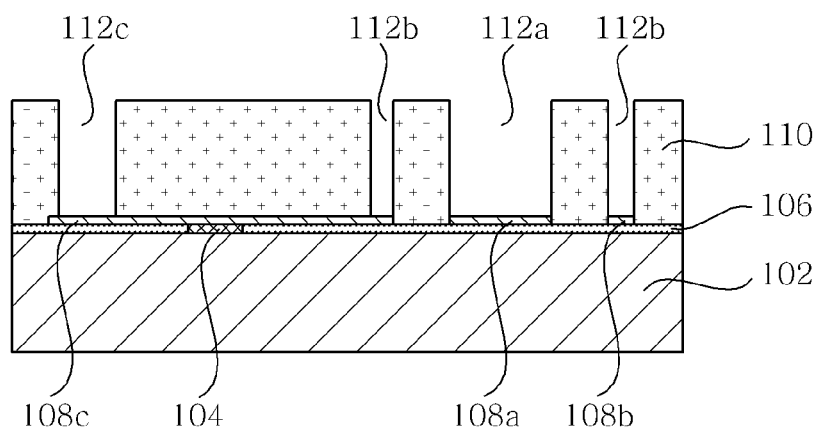
Figure 7B:
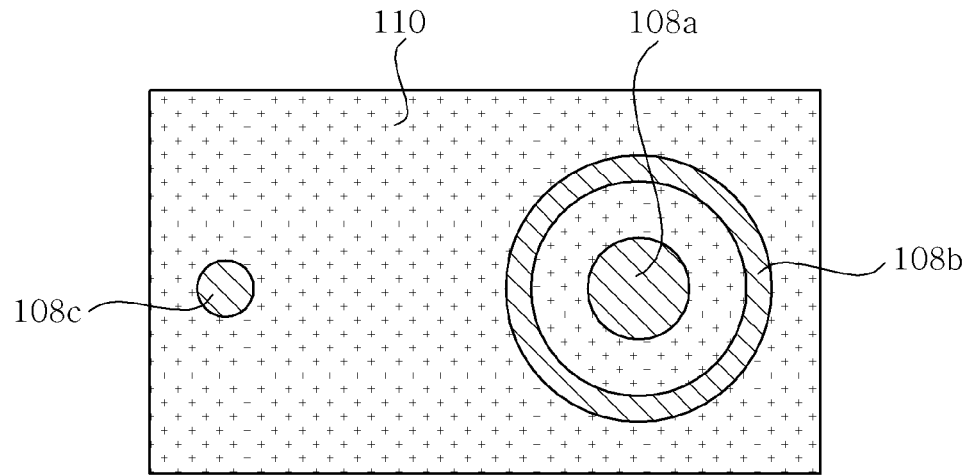

Next, as shown in FIGS. 7A and 7B, a photoresist 110 such as a dry film is applied on the wafer chip 102, and a first opening 112a for exposing the inner electrode member 108a, a second opening 112b for exposing the outer electrode member 108b, and a third opening 112c for exposing the post member 108c are formed in the photoresist 110.

The first, second and third openings 112a, 112b, 112c may be formed by radiating UV light onto portions of the photoresist 110 which are not portions corresponding to the inner electrode member 108a, the outer electrode member 108b and the post member 108c of the redistribution layer 108 using a predetermined mask pattern (not shown), and then removing the unexposed portions of the photoresist 110 using a developing solution such as sodium carbonate ($Na_2CO_3$) or potassium carbonate ($K_2CO_3$).

Figure 8A:
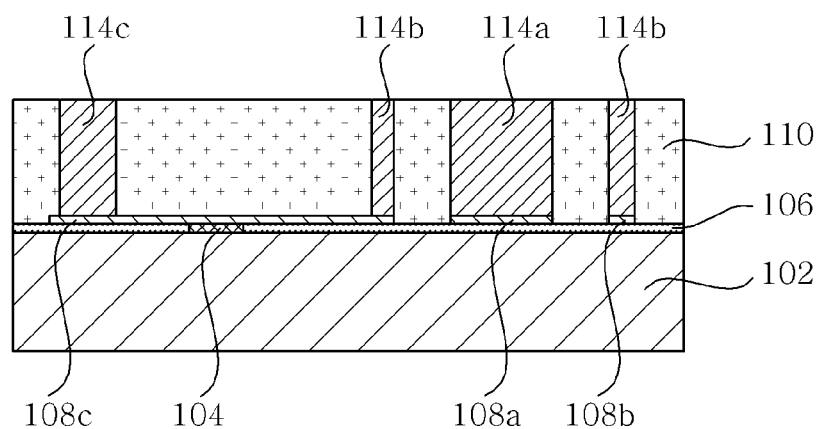
Figure 8B:
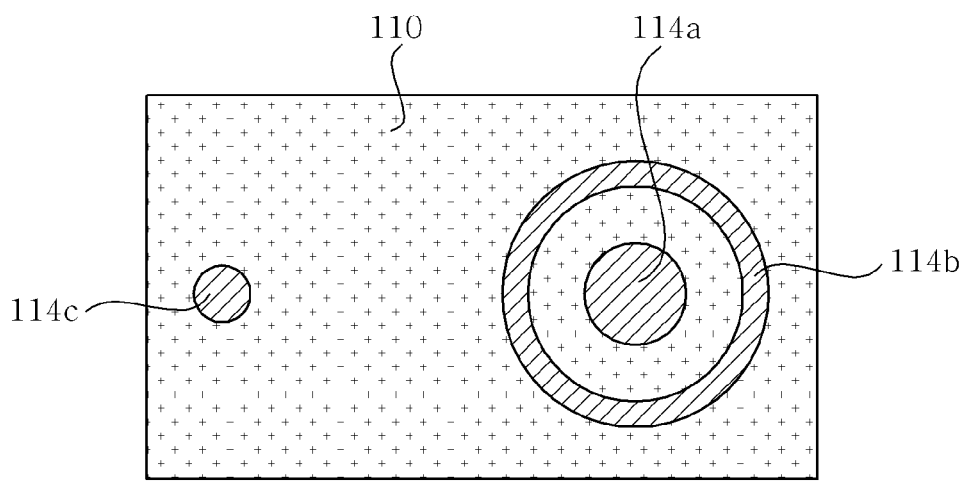

Next, as shown in FIGS. 8A and 8B, a plating process is performed in the first, second and third openings 112a, 112b, 112c. Accordingly, an inner electrode 114a is formed in the first opening 112a, an outer electrode 114b in the second opening 112b, and a metal post 114c in the third opening 112c.

As such, the inner electrode 114a, the outer electrode 114b, and the metal post 114c may be made of an alloy of one or more selected from the group consisting of for example gold, silver, copper and tin.

Figure 9A:
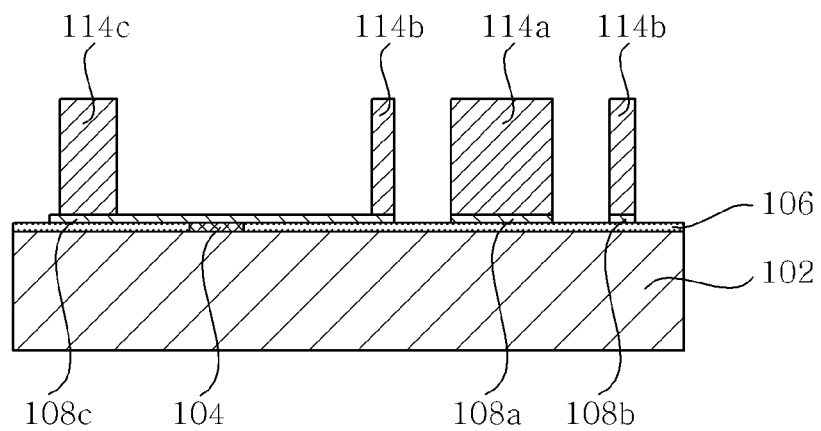
Figure 9B:
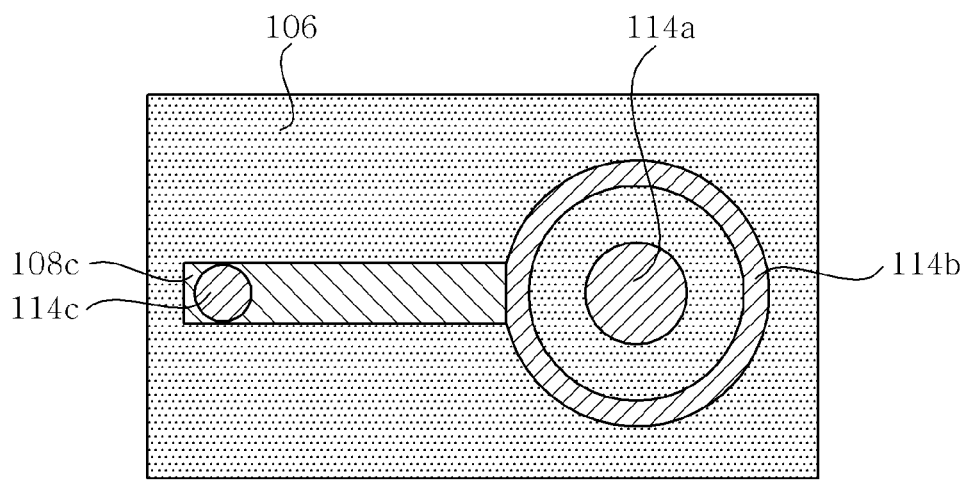

Next, as shown in FIGS. 9A and 9B, the photoresist 110 is removed.

As such, the photoresist 110 may be stripped using a stripping solution such as NaOH or KOH. In the course of the OH⁻ of the stripping solution becoming bonded with the carboxylic group (COOH⁺) of the dry film resist, the photoresist 110 exposed to light may be released and thus may be stripped.

Figure 10A:
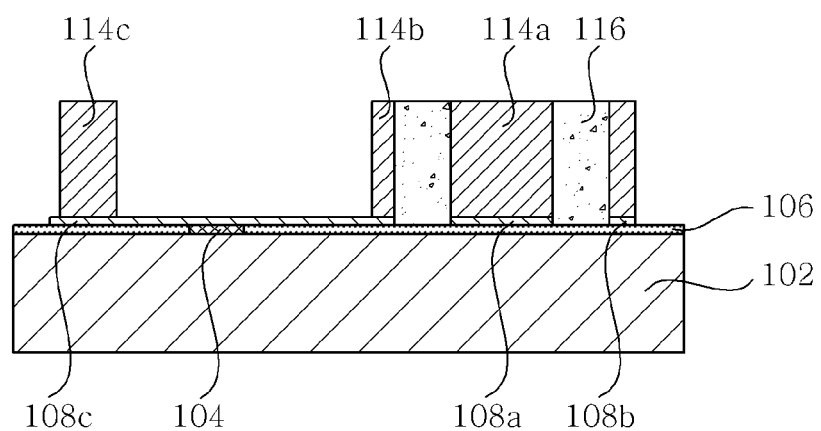
Figure 10B:
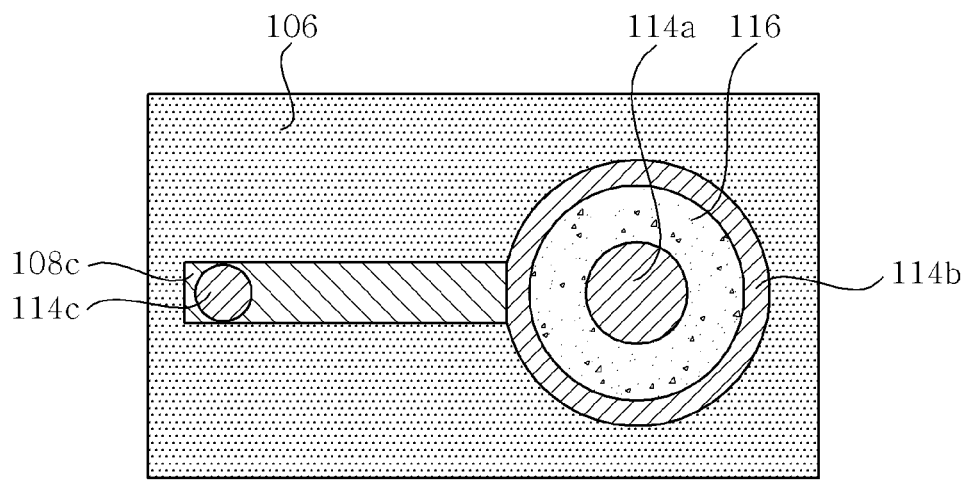

Next, as shown in FIGS. 10A and 10B, the space between the inner electrode 114a and the outer electrode 114b is filled with a dielectric material, after which an annealing process is performed, thus forming a dielectric layer 116. As such, the dielectric material may be charged using screen printing.

Figure 11A:
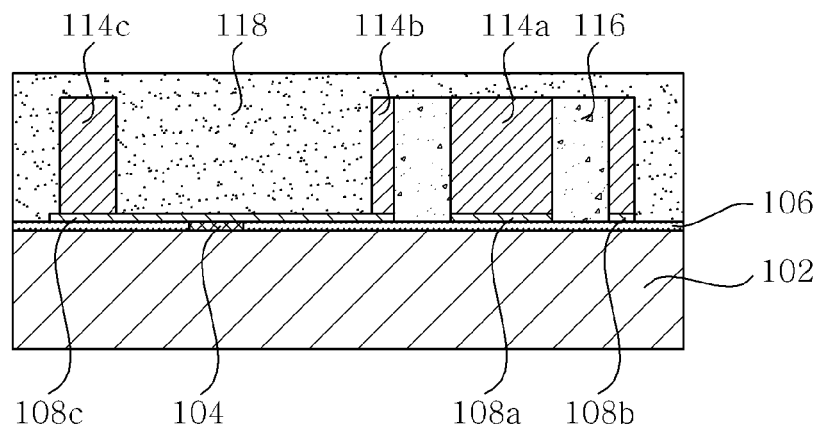
Figure 11B:
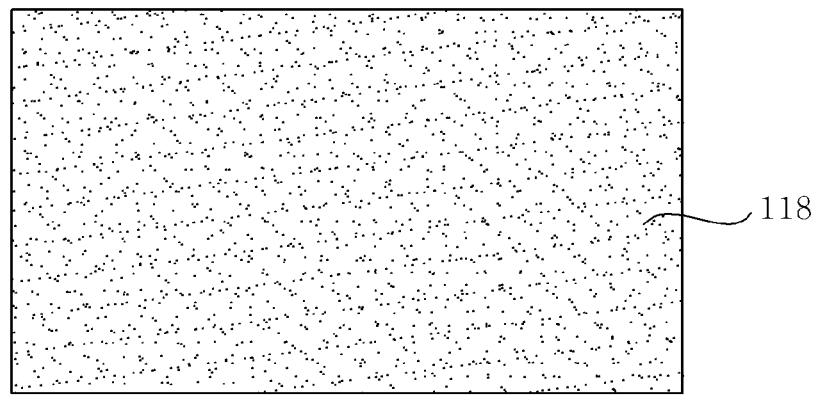

Next, as shown in FIGS. 11A and 11B, a resin sealing portion 118 is formed on the wafer chip 102 so as to cover the inner electrode 114a, the outer electrode 114b and the metal post 114c. As such, the resin sealing portion 118 may be formed through any one process selected from among printing, molding, and spin coating, and may be made of for example an epoxy molding compound.

Figure 12A:
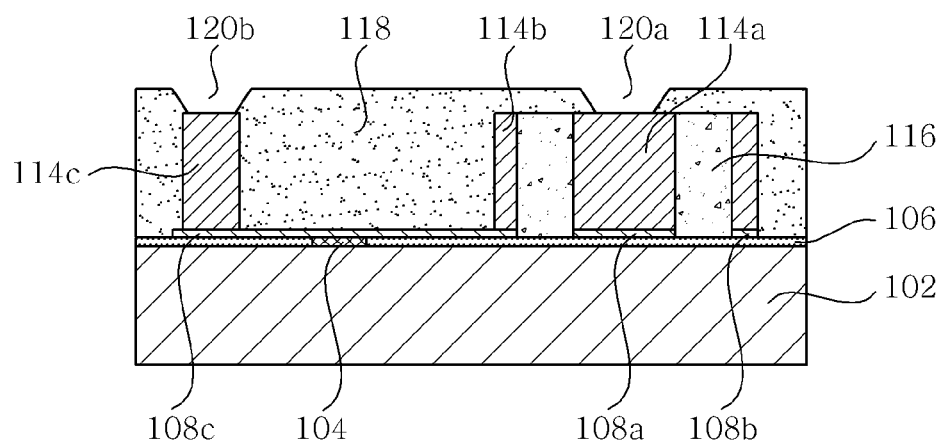
Figure 12B:
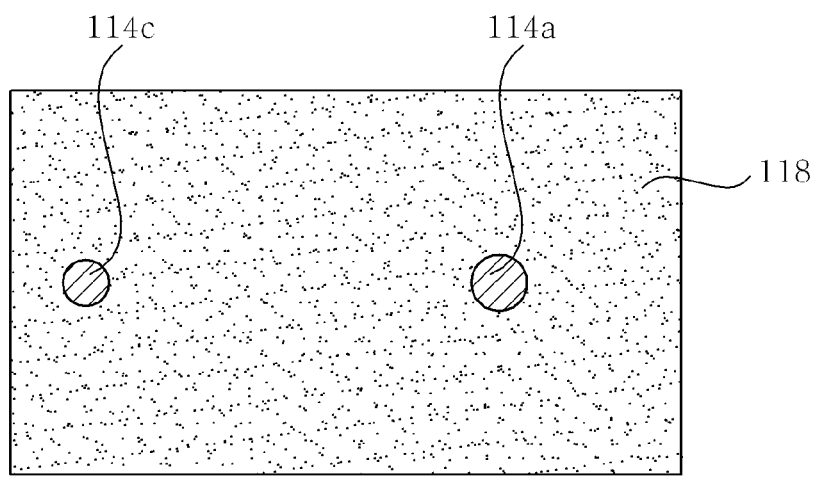

Finally, as shown in FIGS. 12A and 12B, a first recess 120a for exposing the upper surface of the inner electrode 114a and a second recess 120b for exposing the upper surface of the metal post 114c are processed on the resin sealing portion 118. As such, the first recess 120a and the second recess 120b may be formed using for example LDA (Laser Direct Ablation).

Thereby, the wafer level package 100a having the cylindrical capacitor as shown in FIG. 2 may be manufactured using the above manufacturing process.

<Fabrication of Wafer Level Package having Cylindrical Capacitor According to the 2$^{nd}$ Embodiment>

FIGS. 13A and 13B to FIGS. 21A and 21B are cross-sectional views and top plan views, which sequentially show a process of fabricating the wafer level package having the cylindrical capacitor as shown in FIG. 3. Below, the method of fabricating the wafer level package 100b having the cylindrical capacitor according to the present embodiment is specified with reference to the above drawings.

Figure 13A:
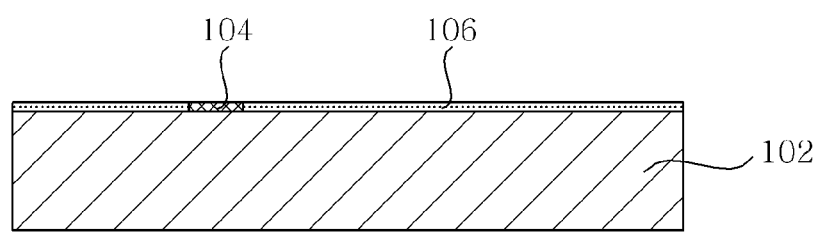
Figure 13B:
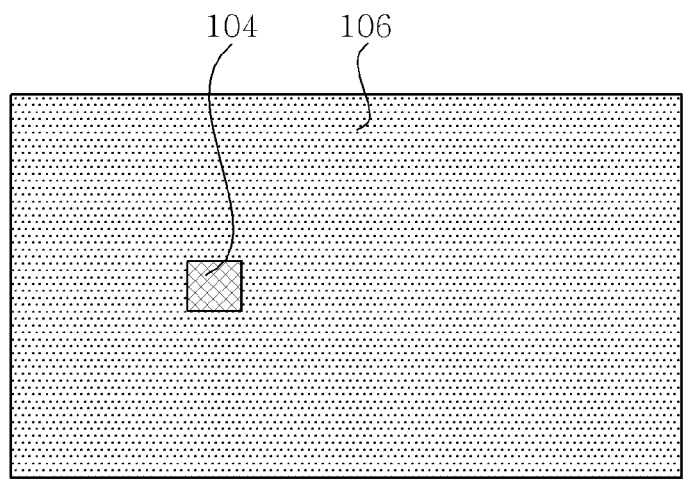

As shown in FIGS. 13A and 13B, a wafer chip 102 is prepared, which includes a chip body, a bonding pad 104 formed on the upper surface of the chip body, and an insulating layer 106 formed on the upper surface of the chip body so as to expose the bonding pad 104.

Figure 14A:
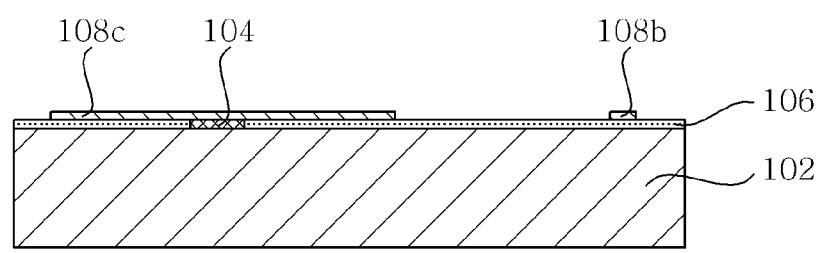
Figure 14B:
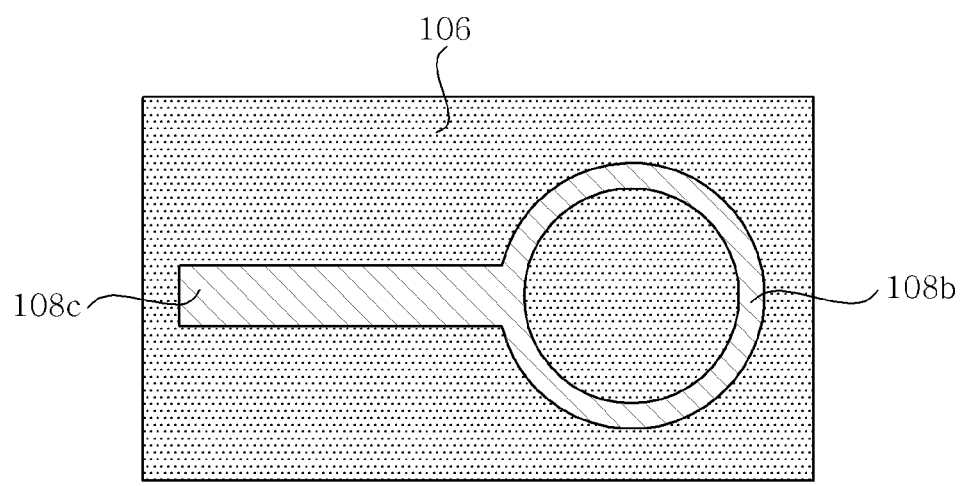

Next, as shown in FIGS. 14A and 14B, a redistribution layer 108b, 108c is formed, which is connected to the bonding pad 104 and extends onto the insulating layer 106.

The redistribution layer 108b, 108c is formed to extend to both sides of the bonding pad 104 from the bonding pad 104. As such, the portion of the redistribution layer extending to one side of the bonding pad 104 is connected to an electrode of the capacitor unit and includes a circular outer electrode member 108b having a center opening therein. The portion of the redistribution layer extending to the other side of the bonding pad 104 may form a post member 108c connected to a post.

Figure 15A:
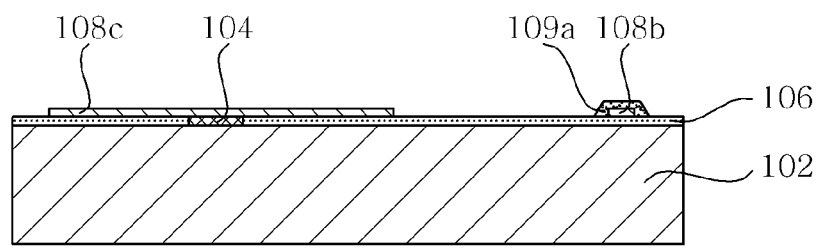
Figure 15B:
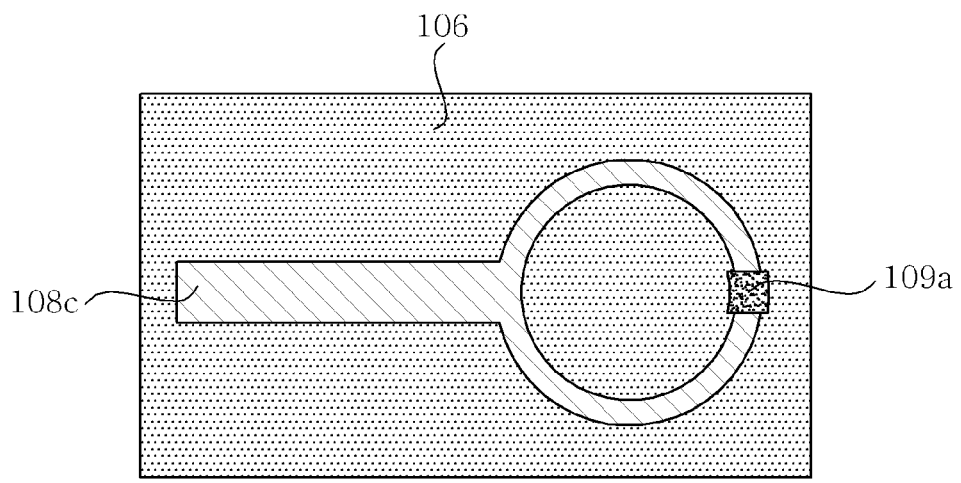

Next, as shown in FIGS. 15A and 15B, a first cover insulating layer 109a for covering a portion of the outer electrode member 108b is formed on the insulating layer 106.

As such, when a peripheral wiring layer 111 as described below is formed to extend into the center opening of the outer electrode member 108b, the first cover insulating layer 109a plays a role in preventing the connection between the peripheral wiring layer 111 and the outer electrode member 108b, and is formed to cover only the portion of the circular outer electrode member 108b having the center opening.

Figure 16A:
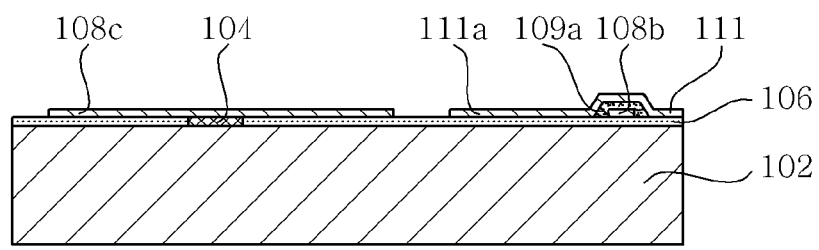
Figure 16B:
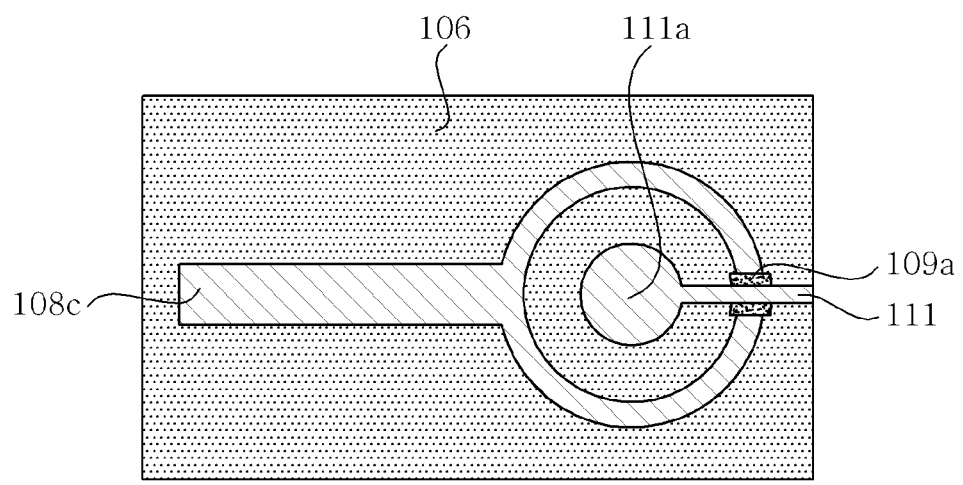

Next, as shown in FIGS. 16A and 16B, the peripheral wiring layer 111 is formed to extend into the center opening of the outer electrode member 108b from one side of the insulating layer 106.

The peripheral wiring layer 111 is formed to extend into the center opening of the outer electrode member 108b across the upper surface of the first cover insulating layer 109a from outside the outer electrode member 108b. As such, the peripheral wiring layer 111 provided in the center opening may form a circular inner electrode member 111a separated from the outer electrode member 108b.

Figure 17A:
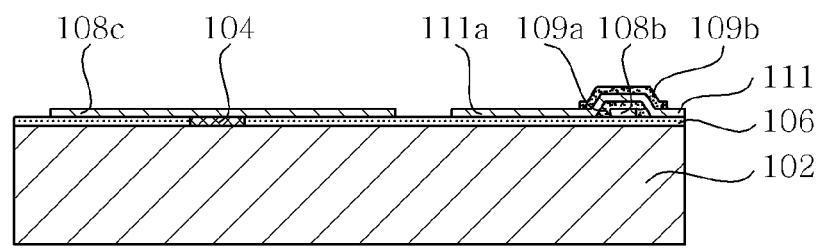
Figure 17B:
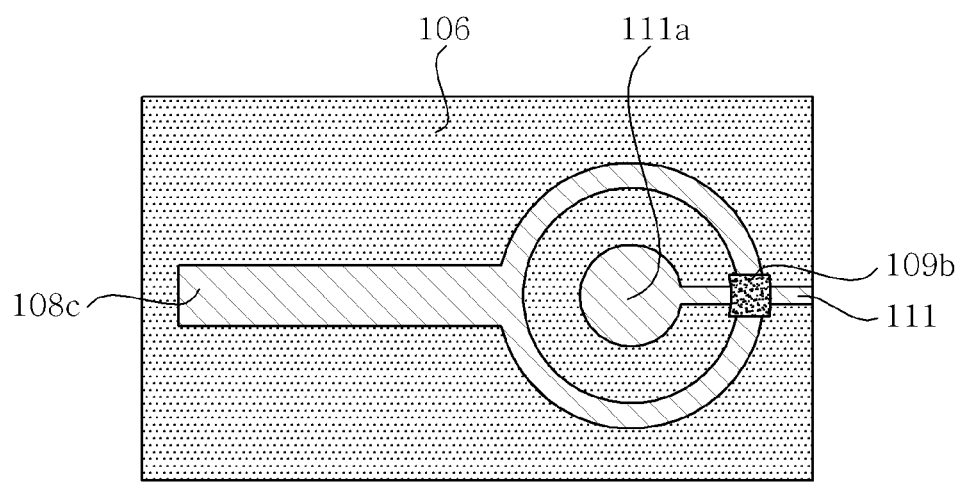

Next, as shown in FIGS. 17A and 17B, a second cover insulating layer 109b for covering a portion of the peripheral wiring layer 111 is formed on the first cover insulating layer 109a on which the peripheral wiring layer 111 has been formed.

As such, the second cover insulating layer 109b plays a role in preventing the peripheral wiring layer 111 from being connected to an outer electrode 114b as described below, and may be formed at the same position as the first cover insulating layer 109a.

Figure 18A:
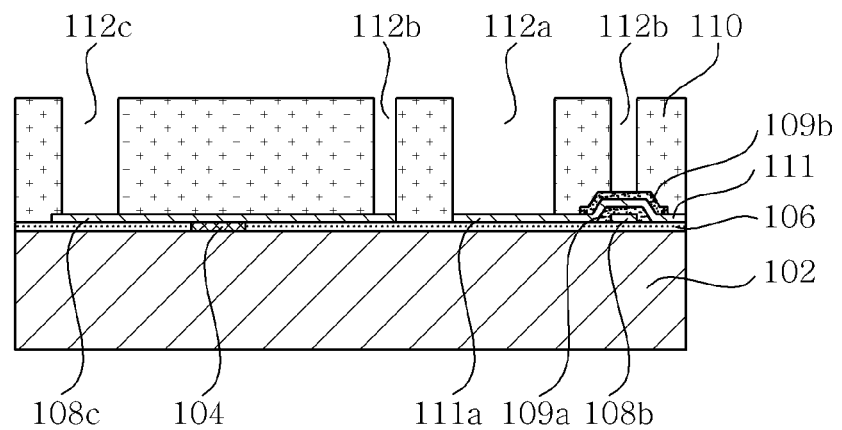
Figure 18B:
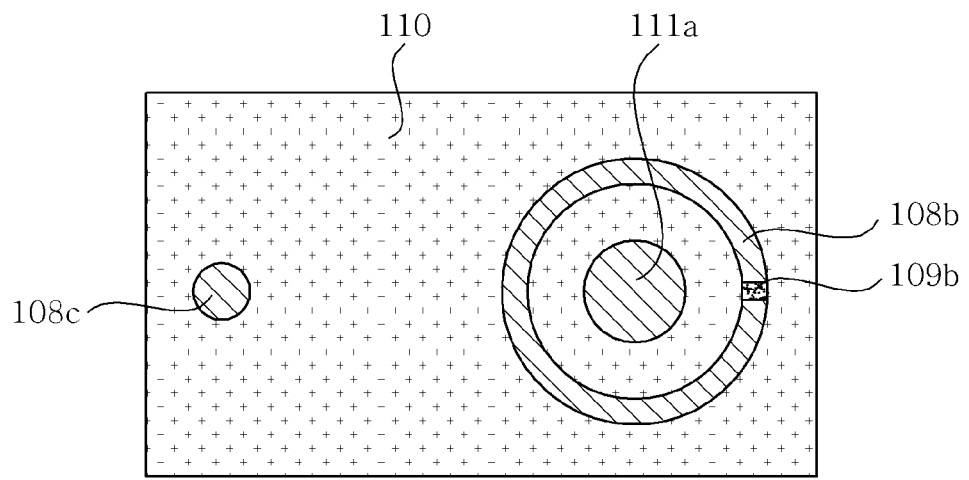

Next, as shown in FIGS. 18A and 18B, a photoresist 110 such as a dry film is applied on the wafer chip 102, and a first opening 112a for exposing the inner electrode member 111a, a second opening 112b for exposing the outer electrode member 108b, and a third opening 112c for exposing the post member 108c are formed in the photoresist 110.

Figure 19A:
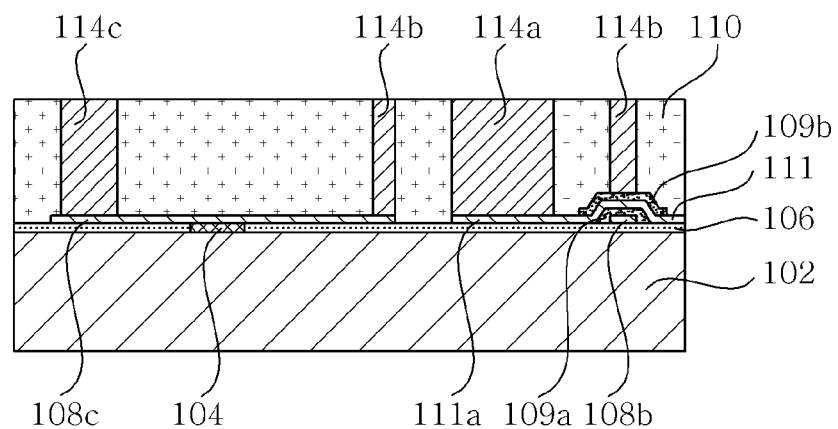
Figure 19B:
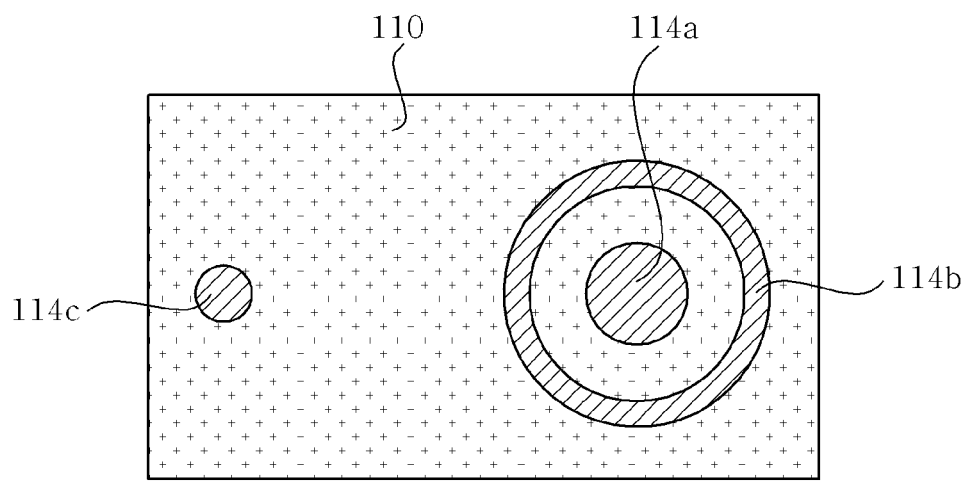

Next, as shown in FIGS. 19A and 19B, a plating process is performed in the first, second and third openings 112a, 112b, 112c. Accordingly, an inner electrode 114a is formed in the first opening 112a, an outer electrode 114b is formed in the second opening 112b, and a metal post 114c is formed in the third opening 112c.

As such, the second cover insulating layer 109b may be formed at a portion of the lower surface of the outer electrode 114b, thus electrically insulating the outer electrode 114b and the peripheral wiring layer 111 from each other.

Figure 20A:
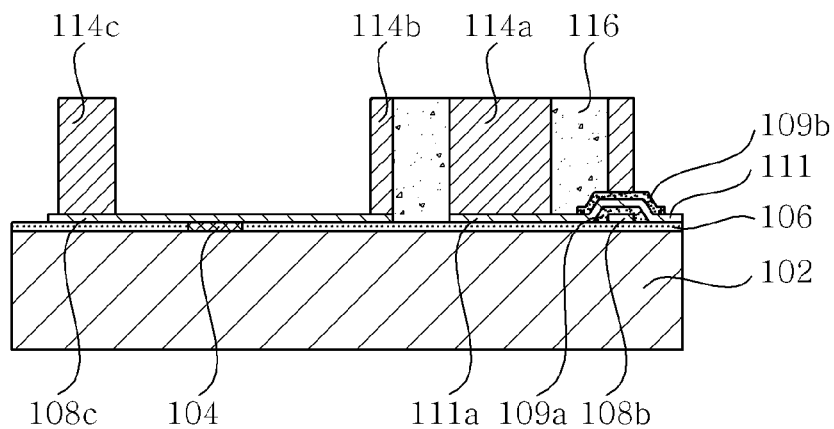
Figure 20B:
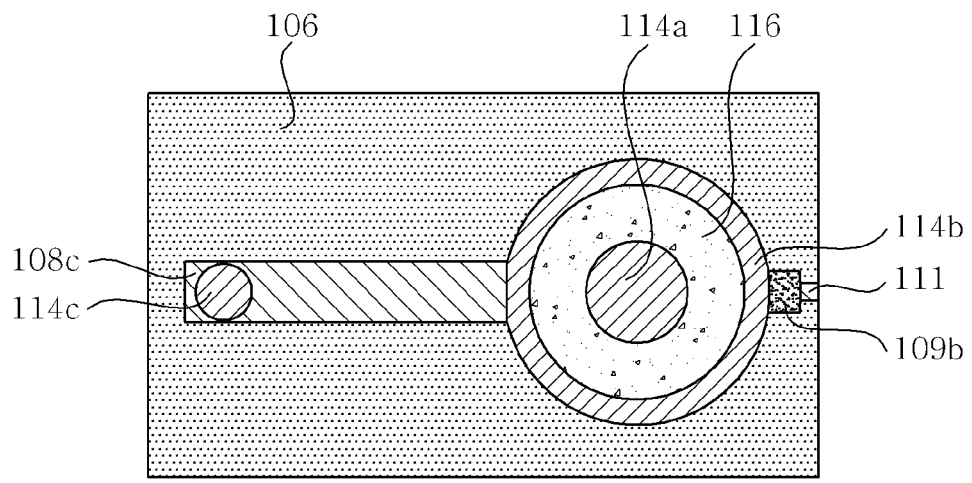

Next, as shown in FIGS. 20A and 20B, the photoresist 110 is removed, and the space between the inner electrode 114a and the outer electrode 114b is filled with a dielectric material, after which an annealing process is performed, thus forming a dielectric layer 116.

Figure 21A:
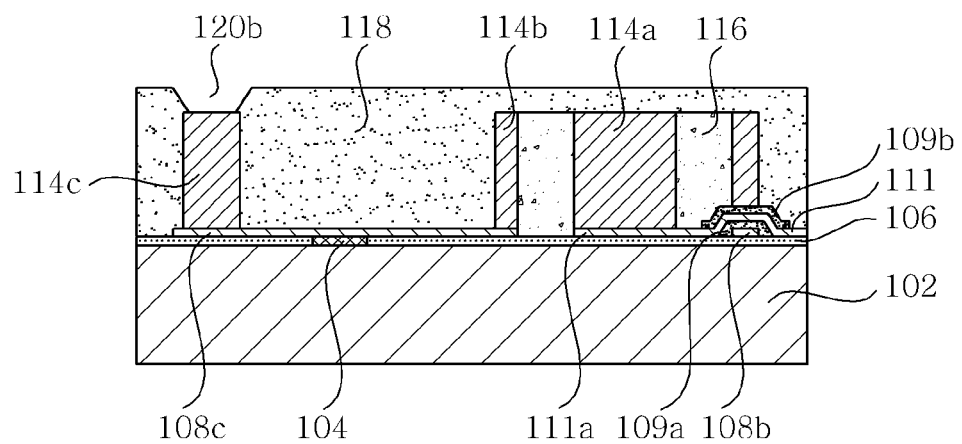
Figure 21B:
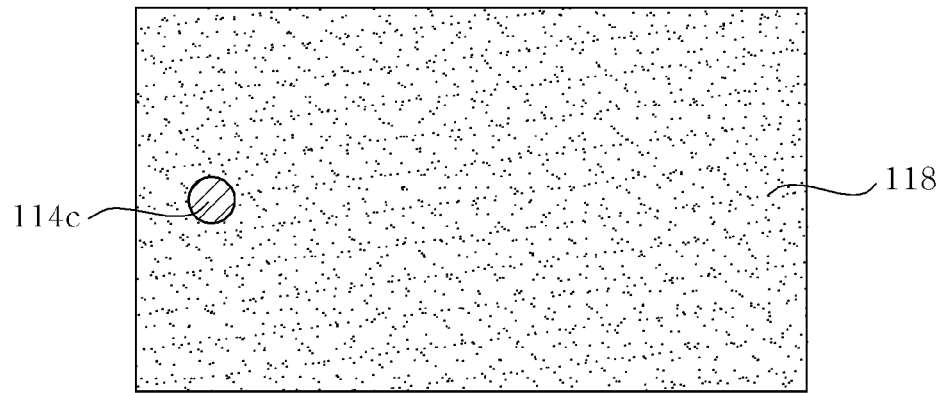

Finally, as shown in FIGS. 21A and 21B, a resin sealing portion 118 is formed on the wafer chip 102 so as to cover the inner electrode 114a, the outer electrode 114b and the metal post 114c. Also, a recess 120b for exposing the upper surface of the metal post 114c is processed on the resin sealing portion 118.

Thereby, the wafer level package 100b having the cylindrical capacitor as shown in FIG. 3 may be manufactured using the above manufacturing process.

<Fabrication of Wafer Level Package having Cylindrical Capacitor According to the 3$^{rd}$ Embodiment>

FIGS. 22A and 22B to FIGS. 29A and 29B are cross-sectional views and top plan views, which sequentially show a process of fabricating the wafer level package having the cylindrical capacitor as shown in FIG. 4. Below, the method of fabricating the wafer level package 100c having the cylindrical capacitor according to the present embodiment is specified with reference to the above drawings.

Figure 22A:
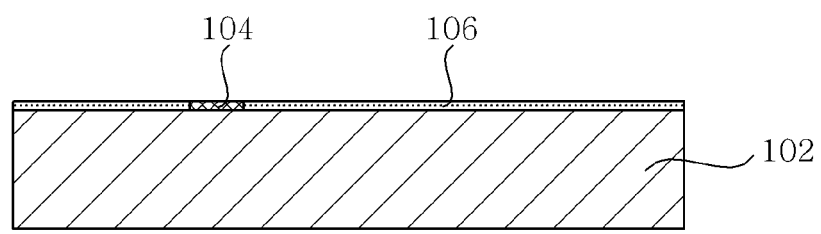
Figure 22B:
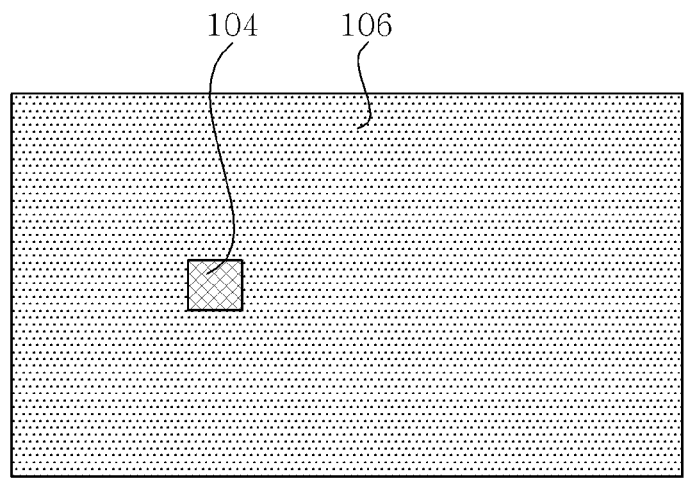

As shown in FIGS. 22A and 22B, a wafer chip 102 is prepared, which includes a chip body, a bonding pad 104, and an insulating layer 106 formed on the upper surface of the chip body so as to expose the bonding pad 104.

Figure 23A:
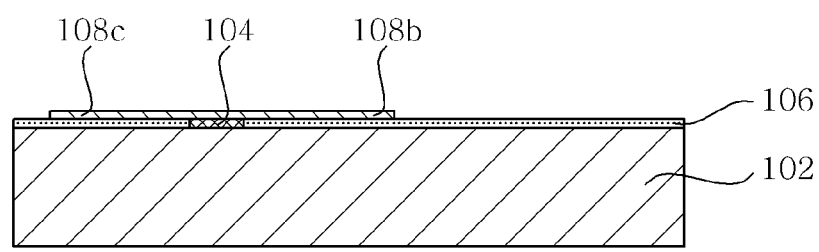
Figure 23B:
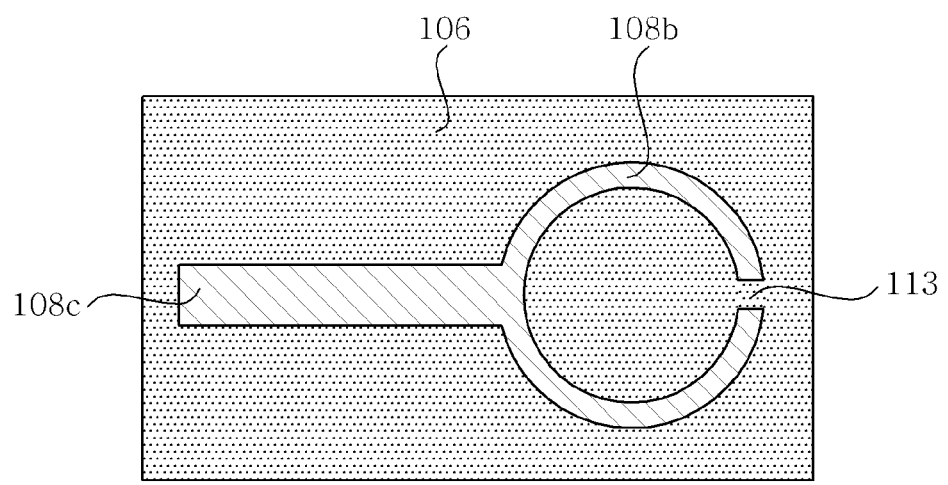

Next, as shown in FIGS. 23A and 23B, a redistribution layer 108b, 108c is formed, which is connected to the bonding pad 104 and extends onto the insulating layer 106.

As such, the portion of the redistribution layer extending to one side of the bonding pad 104 is connected to an electrode of the capacitor unit and includes a circular outer electrode member 108b having a center opening therein and having an open portion 113 formed at a portion thereof. The portion of the redistribution layer extending to the other side of the bonding pad 104 may form a post member 108c.

Next, as shown in FIGS. 24A and 24B, a peripheral wiring layer 111 is formed, which extends into the central opening of the outer electrode member 108b from one side of the insulating layer 106.

As such, the peripheral wiring layer 111 is formed to extend into the center opening of the outer electrode member 108b across the open portion 113 of the outer electrode member 108b from outside the outer electrode member 108b. Thus, the peripheral wiring layer 111 and the outer electrode member 108b may be electrically insulated from each other.

Figure 25A:
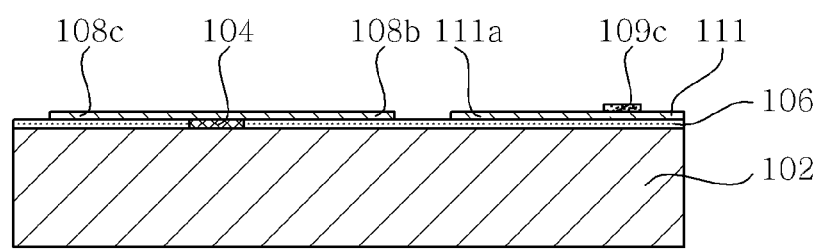
Figure 25B:
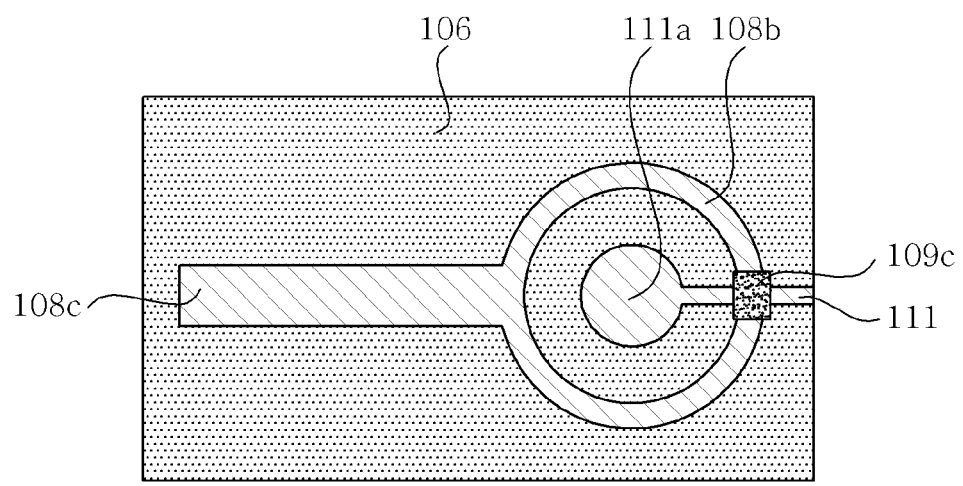
Figure 26A:
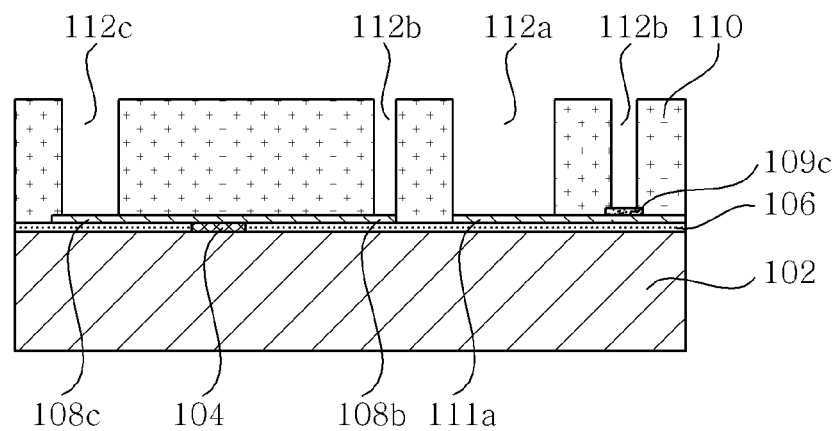
Figure 26B:
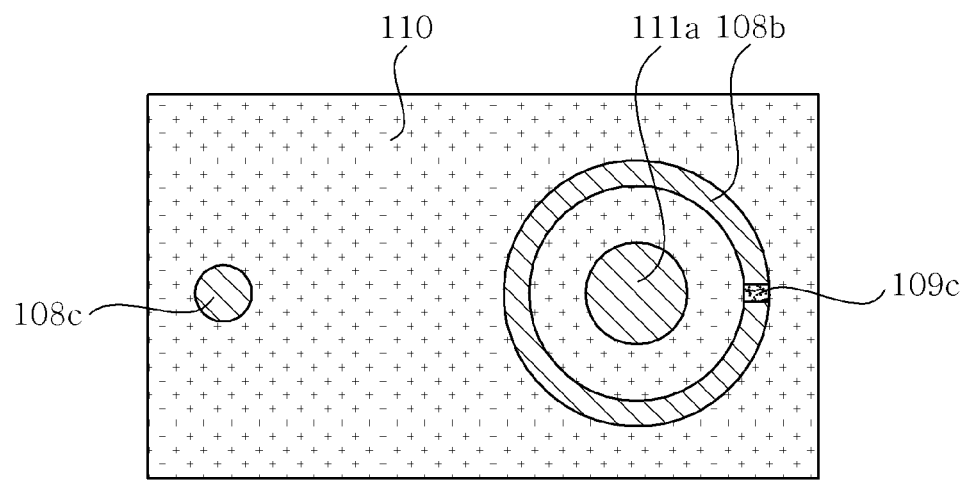
Figure 27A:
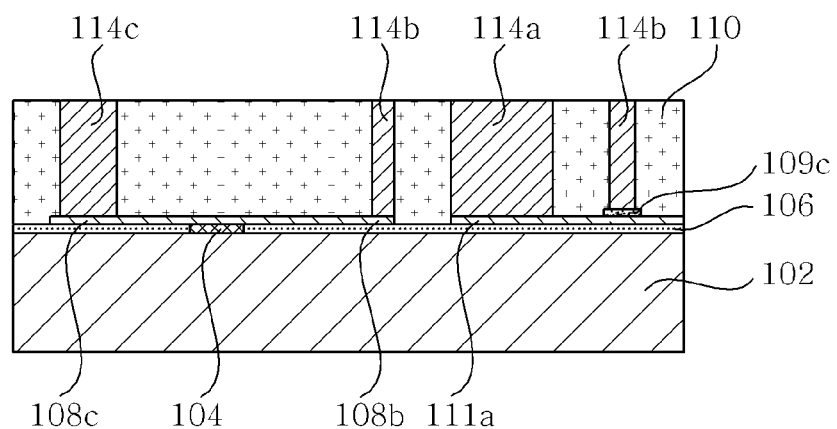
Figure 27B:
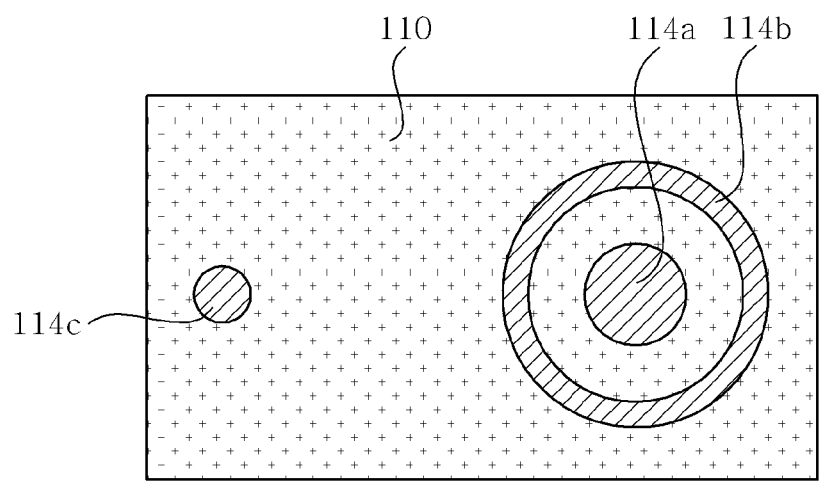
Figure 28A:
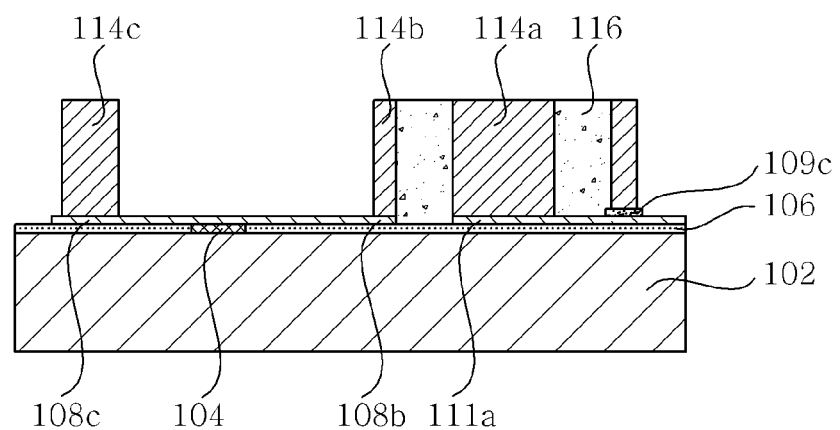
Figure 28B:
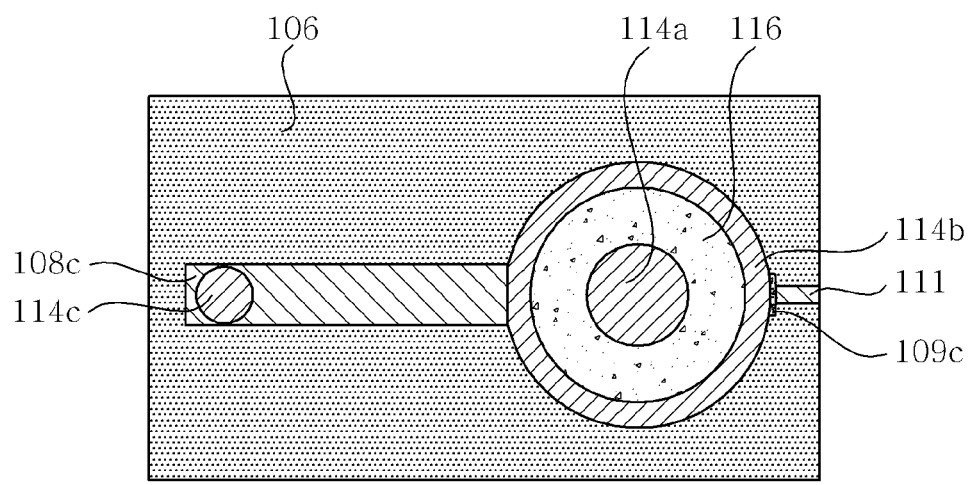
Figure 29A:
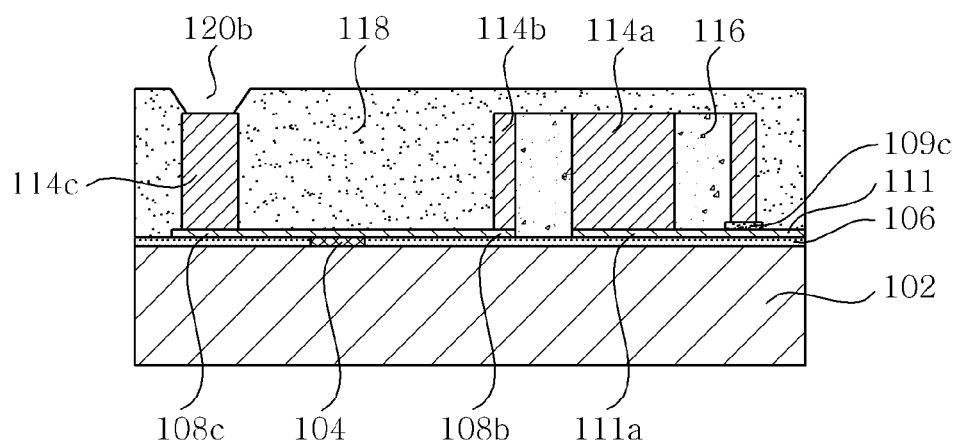
Figure 29B:
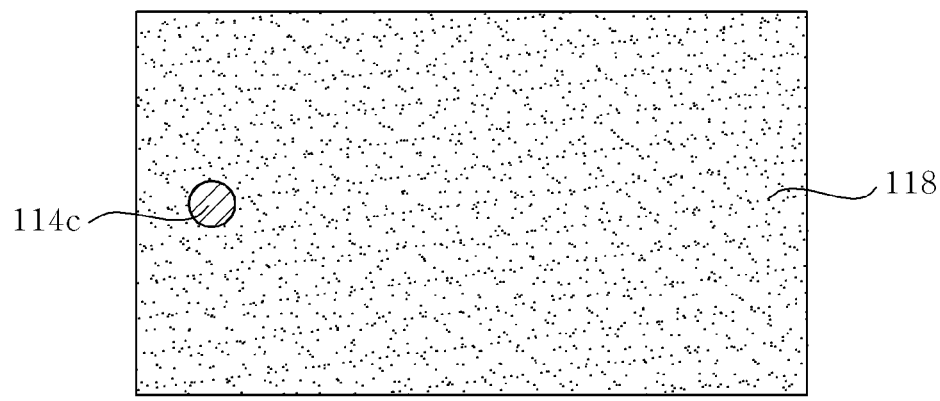

Next, as shown in FIGS. 25A and 25B, a cover insulating layer 109c is formed on the insulating layer 106 so as to cover a portion of the peripheral wiring layer 111.

As such, the cover insulating layer 109c plays a role in preventing the peripheral wiring layer 111 from being connected to an outer electrode 114b which will be described later.

Next, as shown in FIGS. 26A and 26B to 29A and 29B, a photoresist 110 is applied on the wafer chip 102, and a first opening 112a for exposing the inner electrode member 111a, a second opening 112b for exposing the outer electrode member 108b, and a third opening 112c for exposing the post member 108c are formed in the photoresist 110, after which a plating process is performed in the first, second and third openings 112a, 112b, 112c. After the plating process, the photoresist 110 is removed, the space between the inner electrode 114a and the outer electrode 114b is filled with a dielectric material, and then an annealing process is performed, thus forming a dielectric layer 116. Then, a resin sealing portion 118 is formed on the wafer chip 102, and a recess 120b for exposing to the upper surface of the metal post 114c is processed on the resin sealing portion 118.

Thereby, the wafer level package 100c having the cylindrical capacitor as shown in FIG. 4 may be manufactured using the above manufacturing process.

As described hereinbefore, the present invention provides a wafer level package having a cylindrical capacitor and a method of fabricating the same. According to the present invention, because a capacitor unit is provided in cylindrical form, the electrode area is enlarged compared to a two-dimensional planar structure, thus increasing electrostatic capacity, thereby enhancing an effect of reducing noise of the capacitor unit.

Also, according to the present invention, the capacitor unit is formed as high as the height of a metal post, whereby the thickness of the package is not increased due to the capacitor unit.

Also, according to the present invention, a method of forming the cylindrical capacitor unit is provided with the use of a conventional metal post formation process, thereby reducing the process time and the process cost.

Also, according to the present invention, the size of the cylindrical capacitor unit and a distance between an outer electrode and an inner electrode can be simply controlled through a photolithographic patterning process, thereby allowing for easy adjustment of the electrostatic capacity of the capacitor unit.

Although the embodiments of the present invention regarding the wafer level package having the cylindrical capacitor and the method of fabricating the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A wafer level package having a cylindrical capacitor, comprising:
    a wafer chip including a bonding pad formed thereon and an insulating layer formed thereon and exposing the bonding pad;
    a redistribution layer connected to the bonding pad and extending to one side of the insulating layer;
    a cylindrical outer electrode connected to the redistribution layer and having a center opening therein;
    a cylindrical inner electrode formed in the center opening of the outer electrode so as to be separated from the outer electrode;
    a dielectric layer formed between the outer electrode and the inner electrode; and
    a resin sealing portion formed on the insulating layer to cover the redistribution layer, the inner electrode, the outer electrode and the dielectric layer,
    wherein a lower surface of the inner electrode is connected to a peripheral wiring layer which is formed on the insulating layer and which extends from outside the outer electrode into a center opening of the outer electrode so as not to be connected to the outer electrode.

2. The wafer level package as set forth in claim 1, wherein the redistribution layer comprises:
    an outer electrode member formed at a lower surface of the outer electrode and having a center opening and a circular shape; and
    an inner electrode member formed at a lower surface of the inner electrode and having a circular shape so as to be separated from the outer electrode member.

3. The wafer level package as set forth in claim 2, wherein the peripheral wiring layer is formed across an upper surface of a first cover insulating layer formed to cover a portion of the outer electrode member and across a lower surface of a second cover insulating layer formed to cover a portion of the outer electrode, and thus is connected to the inner electrode member from outside the outer electrode member in a state of not being connected to the outer electrode member nor to the outer electrode.

4. The wafer level package as set forth in claim 1, wherein a metal post is formed on a portion of the redistribution layer extending to the other side of the insulating layer, and the resin sealing portion is foamed to cover the metal post and has a recess for exposing an upper surface of the metal post.

5. The wafer level package as set forth in claim 1, wherein the redistribution layer comprises:
    an outer electrode member, which is formed at a lower surface of the outer electrode, has a center opening and a circular shape, and includes an open portion formed at a portion of the outer electrode member; and
    an inner electrode member formed at a lower surface of the inner electrode and having a circular shape so as to be separated from the outer electrode member.

6. The wafer level package as set forth in claim 5, wherein the peripheral wiring layer is formed across a lower surface of a cover insulating layer formed to cover a portion of the outer electrode and the open portion of the outer electrode member, and thus is connected to the inner electrode member from outside the outer electrode member in a state of not being connected to the outer electrode member nor to the outer electrode.

* * * * *